United States Patent
Gawase et al.

(10) Patent No.: US 10,079,153 B2
(45) Date of Patent: Sep. 18, 2018

(54) SEMICONDUCTOR STORAGE DEVICE

(71) Applicant: TOSHIBA MEMORY CORPORATION, Tokyo (JP)

(72) Inventors: Akifumi Gawase, Mie (JP); Yukiteru Matsui, Aichi (JP); Takahiko Kawasaki, Aichi (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/434,310

(22) Filed: Feb. 16, 2017

(65) Prior Publication Data

US 2017/0250081 A1 Aug. 31, 2017

Related U.S. Application Data

(60) Provisional application No. 62/299,684, filed on Feb. 25, 2016.

(51) Int. Cl.

| | | |
|---|---|---|
| *H01L 21/3105* | (2006.01) | |
| *H01L 21/265* | (2006.01) | |
| *H01L 21/306* | (2006.01) | |
| *H01L 21/311* | (2006.01) | |
| *H01L 21/04* | (2006.01) | |
| *H01L 21/266* | (2006.01) | |
| *H01L 21/425* | (2006.01) | |
| *H01L 21/426* | (2006.01) | |
| *H01L 29/16* | (2006.01) | |

(52) U.S. Cl.
CPC .... *H01L 21/31051* (2013.01); *H01L 21/0465* (2013.01); *H01L 21/266* (2013.01); *H01L 21/2654* (2013.01); *H01L 21/26506* (2013.01); *H01L 21/30612* (2013.01); *H01L 21/3105* (2013.01); *H01L 21/31111* (2013.01); *H01L 21/425* (2013.01); *H01L 21/426* (2013.01); *H01L 29/1608* (2013.01)

(58) Field of Classification Search
CPC .......... H01L 21/0475; H01L 21/31051; H01L 21/31111; H01L 21/3105; H01L 21/30612; H01L 21/2654; H01L 21/046; H01L 21/3245
USPC ........................................................ 438/519
See application file for complete search history.

(56) References Cited

U.S. PATENT DOCUMENTS 6,423,639 B1    7/2002 Hong
6,831,015 B1 *  12/2004 Inoue ................. H01L 21/3105
                                                 257/E21.241

(Continued)

FOREIGN PATENT DOCUMENTS

JP    3761546    3/2006
JP    5614677    10/2014

*Primary Examiner* — Fernando L Toledo
*Assistant Examiner* — Adam S Bowen
(74) *Attorney, Agent, or Firm* — Finnegan, Henderson, Farabow, Garrett & Dunner, L.L.P.

(57) ABSTRACT

In a substrate processing method according to the embodiment, a first material is implanted into a surface of a target film to modify the surface of the target film. The surface of the target film is dissolved to remove the surface of the target film by bringing a catalytic material close to the surface of the target film or by contacting the catalytic material to the surface of the target film while supplying a process solution on the surface of the target film which has been modified.

17 Claims, 6 Drawing Sheets

(56) References Cited

U.S. PATENT DOCUMENTS

2016/0377769 A1* 12/2016 Hamamoto ............... G03F 1/24
                                                      355/77
2017/0047237 A1*  2/2017 Kobata .................. H01L 22/26

* cited by examiner

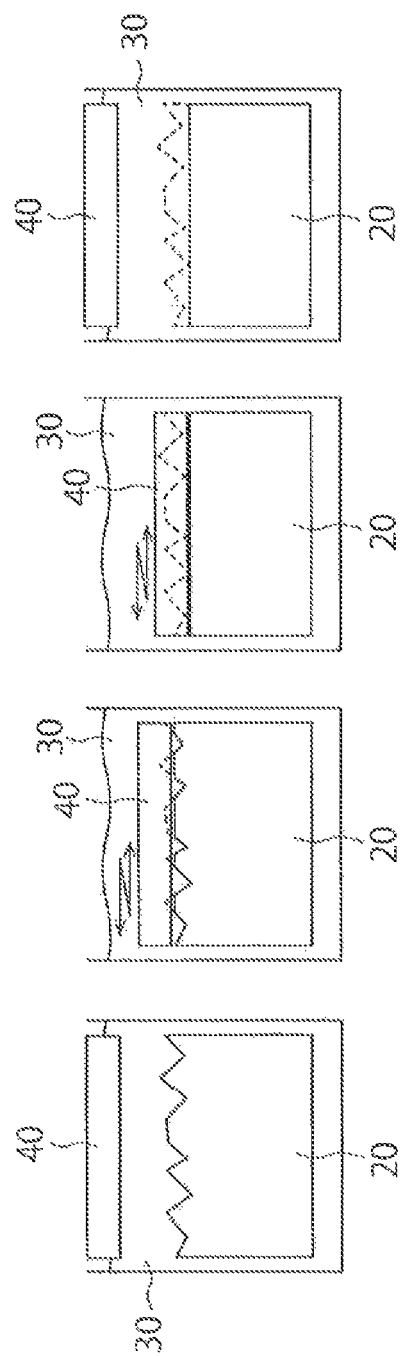

SEMICONDUCTOR STORAGE DEVICE

CROSS REFERENCE TO RELATED APPLICATIONS

This application is based upon and claims the benefit of priority from the prior U.S. Provisional Patent Application No. 62/299,684, filed on Feb. 25, 2016, the entire contents of which are incorporated herein by reference.

FIELD

The embodiments of the present invention relate to a semiconductor device and manufacturing method thereof.

BACKGROUND

Recently, materials of silicon carbide (SiC), gallium nitride (GaN), and the like, are used to improve the characteristics of the semiconductor devices. These materials have hardness higher than silicon and are more difficult to process than silicon. To flatten such as the hard materials, a planarization technique such as a CMP (Chemical Mechanical Polishing) method, and the like, has been used. However, the conventional planarization techniques have problems such as an insufficient polishing rate, degradation in the in-plane uniformity of the materials after polishing, and increase crystal defects in the materials

BRIEF DESCRIPTION OF THE DRAWINGS

FIGS. 1 to 4D are schematic diagrams showing a substrate processing method of the first embodiment;

DETAILED DESCRIPTION

Embodiments will now be explained with reference to the accompanying drawings. The present invention is not limited to the embodiments.

In a substrate processing method according to the embodiment, a first material is implanted into a surface of a target film to modify the surface of the target film. The surface of the target film is dissolved to remove the surface of the target film by bringing a catalytic material close to the surface of the target film or by contacting the catalytic material to the surface of the target film while supplying a process solution on the surface of the target film which has been modified.

(First Embodiment)

FIGS. 1 to 4D are schematic diagrams showing a substrate processing method of the first embodiment. A semiconductor substrate 10 is a semiconductor substrate, such as a silicon substrate, for example. A target film 20 is a film which has relatively higher hardness, such as a silicon carbide (SiC), a gallium nitride (GaN), an aluminum oxide ($Al_2O_3$), for example, provided on a surface of the semiconductor substrate 10. The substrate processing method is used to planarize, for example, the target film 20, when forming the semiconductor devices on the semiconductor substrate 10. Alternately, the substrate processing method may be used for planarization of the target film 20 which is, for example, served as a composing element of the semiconductor device. The semiconductor devices may be, but is not limited to, a semiconductor memory device, a high-speed logic LSI, a memory and logic consolidated LSI, a power semiconductor device and the like, for example.

Figure 1:
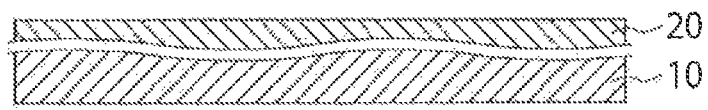

First, as shown in FIG. 1, the target film 20 is formed on a surface of the semiconductor substrate 10. The semiconductor substrate 10 may be a silicon substrate and the like, for example. The target film 20 includes at least a material among a silicon carbide (SiC), a gallium nitride (GaN), an aluminum oxide ($Al_2O_3$), for example, and is a crystalline film which has hardness higher than silicon (or which is more difficult to process than silicon). Semiconductor elements such as transistors (not shown) are formed on the semiconductor substrate 10 covered with the target film 20. Alternately, the target film 20 may be a composing element of a part of the semiconductor elements or, may be a film covering above the semiconductor elements. The target film 20 is a subject film planarized by the substrate processing method according to the embodiment.

Figure 2A:
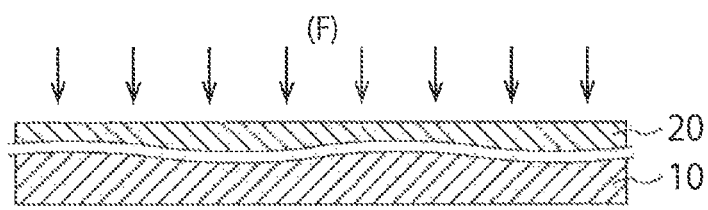
Figure 2B:
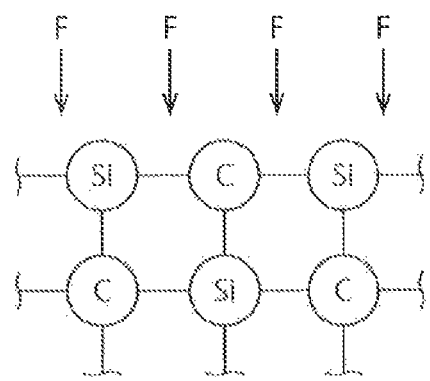
Figure 2C:
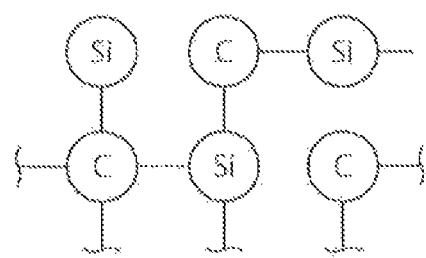

Next, as shown in FIGS. 2A to 2C, ions of a first material are implanted into the target film 20. The first material includes at least a type of material among fluorine (F), boron (B), phosphorus (P), nitrogen (N), arsenic (As) and gallium (Ga). The ion-implantation is performed with the dopant of the first material in a dose amount of about $1\times10^{14}/cm^2$ to about $1\times10^{18}/cm^2$ and at an acceleration voltage of about 5 keV to about 200 keV. The dopant of the first material may be implanted into the entire surface of the target film 20 or into a part of the surface of it, which part needs to be planarized. An embodiment that the first material is implanted into a part of the target film 20 is described in the second embodiment.

The ion-implantation of the first material weakens crystal binding in a surface area of the target film 20 (binding between Si and C in an SiC film, binding between Ga and N in a GaN film, or binding between Al and O in a $Al_2O_3$ film, for example) or breaks crystal binding therein, and modifies the surface of the target film 20. For example, when fluorine served as the first material is implanted into an SiC film served as the target film 20 as shown in FIG. 2B, the SiC binding is broken or weakened (see a dashed line of FIG. 2C), as shown in FIG. 2C.

Figure 3A:
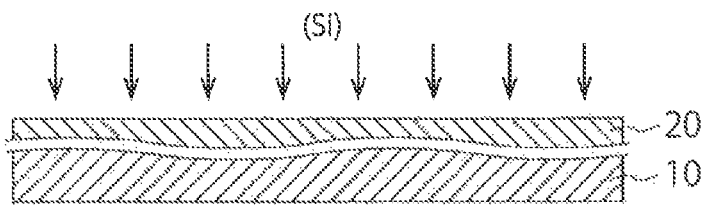
Figure 3B:
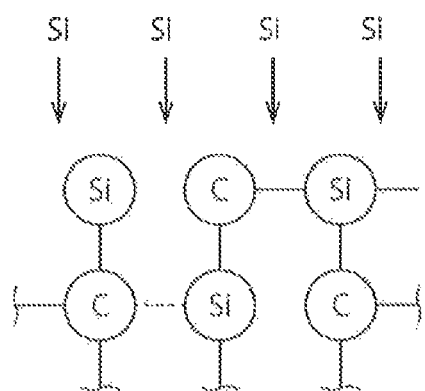
Figure 3C:
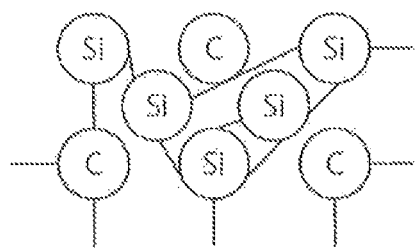

Next, as shown in FIGS. 3A to 3C, ions of a second material are implanted into the target film 20. The second material includes at least a type of material among silicon (Si), carbon (C), germanium (Ge), gallium (Ga). The ion-implantation is performed with the dopant of the second material in a dose amount of about $1\times10^{14}/cm^2$ to about $1\times10^{18}/cm^2$ and at an acceleration voltage of about 5 keV to about 200 keV. The dopant of the second material may be implanted into the area that the first material is implanted. Accordingly, the dopant of the second material may be implanted into the entire surface of the target film 20 or may be locally implanted into the part which needs to be planarized.

The second material binds to the material of the target film 20 in the surface region of the target film 20, in which the crystal binding is broken or weakened. For example, as shown in FIGS. 3B and 3C, when the target film 20 is an SiC film and the second material is an Si, the Si served as the second material bonds to dangling bonds of Si in the broken Si—C or gets into the weakened Si—C bonding and bonds to Si of the weakened Si—C in the target film 20. For example, not shown in figures, when the target film 20 is a GaN film and the second material is a Ga, the Ga served as the second material bonds to dangling bonds of Ga in the broken Ga—N or gets into the weakened Ga—N bonding and bonds to Ga of the weakened Ga—N in the target film 20.

Ga is implanted as the first material when the target film 20 is a crystalline film (e.g. SiC and the like) including silicon. On the other hand, Ga is implanted as the second material when the target film 20 is a crystalline film (e.g. GaN and the like) including gallium. That is, Ga can have either function of the first material or the second material in dependent on the material of the target film 20.

Next, the target film 20 is thermally treated. The thermal treatment is executed at a temperature equal to or higher than 400° C. Thereby, the second material can robustly bond to the material of the target film 20. For example, when the target film 20 is an SiC film and the second material is an Si, Si served as the second material robustly bonds to Si of the target film 20 by the thermal treatment. Or, when the target film 20 is a GaN film and the second material is a Ga, Ga served as the second material robustly bonds to Ga of the target film 20 by the thermal treatment. The thermal treatment may be executed after the implantation of the second material or at the same time as the implantation of the second material. When the thermal treatment may be executed at the same time as the implantation of the second material, the process period of the substrate processing method of the embodiment can be reduced.

Thus, the surface of the target film 20 is modified by the implantation of the first and the second materials.

Next, as shown in FIGS. 4A to 4D, the target film 20 is polished chemically using a catalyst-referred etching method. In the catalyst-referred etching method (so-called, CARE (Catalyst-Referred Etching)), the surface of the target film 20 is dissolved and etched by immersing the target film 20 into a process liquid 30 and by bringing a catalytic material 40 close to the surface of the target film 20 or by contacting the catalytic material 40 close to the surface of the target film 20.

For example, as shown in FIG. 4A, the target film 20 is immersed into the process liquid 30 including hydrohalic acid such as hydrofluoric acid and the like. Next, as shown in FIG. 4B, the catalytic material 40 made of platinum, gold, silver or ceramic solid catalyst is brought close to or contacts to the surface (the surface to be processed) of the target film 20. Radicals of halogen (hereinafter, halogen radicals) are generated when hydrogen halide molecularly dissociates on the surface of the catalytic material 40. Halogen compounds are generated by chemically reacting the halogen radicals with atomics (for example, Si, Ga, Al and the like) of surface of the target film 20 and the second material. When the halogen compounds are dissolved into the process liquid 30, the surface of the target film 20 (and the second material) is etched and removed.

In the catalyst-referred etching method, the halogen radicals generated on the opposite surface of the catalytic material 40, which surface is opposed to the target film 20, is easy to be deactivated. While the halogen radicals are in an active state in vicinity of the opposite surface of the catalytic material 40, the halogen radicals are deactivated when being apart from the opposite surface of the catalytic material 40. Accordingly, the surface of the target film 20 which is dose to or contacts the opposite surface of the catalytic material 40 can be etched by the halogen radicals.

For example, as shown in FIGS. 4B to 4D, a part of the surface of the target film 20, which part is dose to or contacts the opposite surface of the catalytic material 40, is etched. The opposite surface of the catalytic material 40 is a surface opposing to the processed surface of the target film 20. A convex part of the surface of the target film 20 is easier to be dose to or to contact the opposite surface of the catalytic material 40 than a concave part thereof. The concave part of the target film 20 is easy to be apart from the opposite surface of the catalytic material 40. Therefore, the convex part of the target film 20 is etched, but the concave part thereof is not etched very much. As a result, the surface of the target film 20 is etched in accordance with the opposite surface of the catalytic material 40 and is planarized in the same degree with the planarization of the opposite surface of the catalytic material 40. Therefore, even if the surface of the target film 20 has a concave-convex shape, the surface of the target film 20 can be processed to be planarized as long as the opposite surface of the catalytic material 40 is flat and smooth. That is, the surface of the target film 20 is etched and planarized with referred to the opposite surface of the catalytic material 40.

During etching process, the catalytic material 40 may be moved relative to the target film 20 in a direction approximately perpendicular to the opposite surface of the catalytic material 40 or be rotated relative to the target film 20.

In the embodiment, before executing the catalyst-referred etching method, the surface of the target film 20 is modified by the implantation of the first and second materials. Accordingly, the crystalline binding of the target film 20 is broken or weakened, or binds to the second material. For example, when the target film 20 is an SiC film, crystalline of SiCC is broken or weakened by the implantation of the first and second materials. Or, after the crystalline of SiC is broken, Si served as the second material binds to dangling bonds of Si in the target film 20. Therefore, binds of Si—Si are formed instead of many of Si—C bonding in the target film 20. Thus, since the surface area of the target film 20 becomes rich in silicon, the surface of the target film 20 which is closed to or contacts the opposite surface of the catalytic material 40 can be etched in a high rate by the halogen radicals. Accordingly, using the substrate processing method of the first embodiment, the hard materials such as a SiC, GaN, and the like can be planarized in a relatively short time period.

Furthermore, the catalyst-referred etching method planarizes the surface of the target film 20 using a chemical polishing, but not a mechanical polishing. As a result, the surface of the target film 20 has relatively few crystalline defects after the etching process.

After the planarization of the surface of the target film 20, the target film 20 is used to form semiconductor devices thereon, or semiconductor devices using the target film 20 is formed. For example, in general, an SiC substrate is expensive. However, a substrate having a silicon substrate and an SiC film served as the target film 20 covering the surface of the silicon substrate can be cheaper than the SiC substrate. Semiconductor devices can be formed on an SiC layer, even if such the silicon substrate covered with the SiC film is used as a substrate. According to the embodiment, for example, a power semiconductor device having a low on-resistance and a high breakdown voltage can be manufactured inexpensively. Thus, an SiC substrate or a GaN substrate and the like is used to manufacture the power semiconductor devices.

However, it is possible to easily process such the hard material at high rate by using the substrate processing method according to the embodiment.

Of course, the substrate processing method according to the embodiment may be used for formation of elements in a part of the semiconductor devices. For example, the substrate processing method may be used for processing a GaN layer or an AlGaN layer of HEMT (High Electron Mobility Transistor) or HFET (Heterojunction Field Effect Transistor), and the like.

(Second Embodiment)

Figure 5:
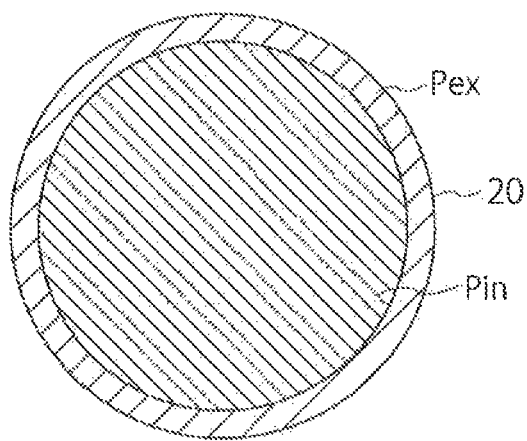
FIG. 5 is a plan view showing a manufacturing method of a semiconductor device according to a second embodiment.

FIG. 5 is a plan view showing a manufacturing method of a semiconductor device according to a second embodiment. In the second embodiment, the first and second materials are implanted selectively into a part (a central portion Pin except an outer peripheral portion Pex) of the surface area of the target film 20. For example, the second embodiment is used when it is desired to selectively etch the central portion Pin faster than the outer peripheral portion Pex of the target film 20.

Firstly, the first material is selectively ion-implanted into the central portion Pin of the target film 20. According to the implantation, the crystal binding in the central portion Pin of the target film 20 is broken or weakened.

Next, the second material is selectively ion-implanted into the central portion Pin of the target film 20. Then, the target film 20 is annealed to bind the second material to the material of the target film 20 in the central portion Pin. Thus, the characteristic of the surface part (the central portion Pin) of the target film 20 is changed by implanting the first and second materials.

Next, the target film 20 is chemically polished using the catalyst-referred etching method as described referring FIGS. 4A to 4D. Since the central portion Pin on the surface of the target film 20 is modified by the implantation of the first and second materials, the central portion Pin on the surface of the target film 20 can be etched at higher rate than the outer peripheral portion Pex thereof. According to the substrate processing method according to the second embodiment, it is possible to selectively etch the central portion Pin of the hard material such as an SiC or a GaN and the like during a relatively short time period.

In the second embodiment, the central portion Pin of the target film 20 is selectively etched, However, the portion selectively etched may be changed arbitrarily. For example, when a portion of the target film 20 where the first and second materials are implanted is changed, the portion selectively etched may be changed. The portion of the target film 20 where the first and second materials are implanted may be changed by changing patterns of a photoresist mask for a lithography technique. Alternately, the portion of the target film 20 where the first and second materials are implanted may be changed by changing a shape of an ion beam mask as described below.

According to the second embodiment, a part of a surface of the target film 20 can be selectively etched or planarized. As a result, the part of the surface of the target film 20 can have the same effects of the first embodiment.

Figure 6:
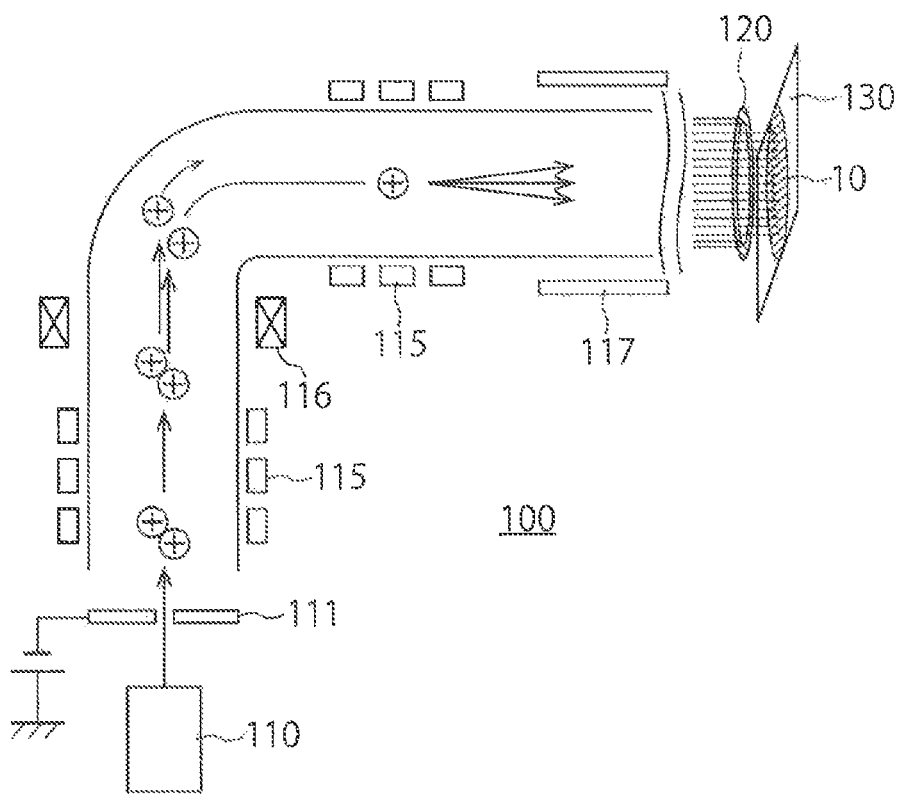
FIG. 6 is a schematic configuration diagram showing an ion implantation device 100 including an ion beam mask 120 according to the second embodiment.

FIG. 6 is a schematic configuration diagram showing an ion implantation device 100 including an ion beam mask 120 according to the second embodiment.

The ion implantation device 100 includes an ion source 110, an extraction electrode 111, an accelerator 115, a mass separator 116, a scanner 117, the ion beam mask 120, a substrate holder (a susceptor) 130, and a mask transporter (not shown). The ion source 110 ionizes a dopant. The extraction electrode 111 extracts the ionized dopant from the ion source 110. The accelerator 115 accelerates the ionized dopant to form an ion beam and irradiates the ion beam toward the substrate holder 130. That is, the ion source 110 and the accelerator 115 function as an ion beam irradiator. The mass separator 116 is provided to select a desired ion type according to a difference in mass and to irradiate the selected ion to the semiconductor substrate 10. The mass separator 116 or the accelerator 115 can include a mass spectrometry magnet or a mass spectrometry slit. The scanner 117 adjusts the direction of irradiation of the ion beam. The substrate holder 130 has the semiconductor substrate 10 mounted thereon.

The ion beam mask 120 is formed annularly to block the ion beam to be irradiated to the outer peripheral portion Pex of the semiconductor substrate 10 (the surface of the target film 20). For example, when the semiconductor substrate 10 is a semiconductor wafer having a diameter of 300 millimeters, the ion beam mask 120 can be an annular mask having an opening with a diameter of about 260 millimeters and having a width of about 20 millimeters. By using the ion beam mask 120 thus formed, the ion beam is irradiated selectively to the surface of the target film 20 at the central portion Pin of the semiconductor substrate 10. Accordingly, ions of the dopant are implanted into the target film 20 at the central portion Pin of the semiconductor substrate 10. The ion beam mask 120 is made of a non-metallic material such as a semiconductor material, graphite, diamond-like carbon (DLC), Si, or SiC. A semiconductor wafer (a silicon wafer, for example) can be alternatively used as the ion beam mask 120. In this way, the ion implantation device 100 used in the second embodiment irradiates an ion beam to the target film 20 to increase the polishing rate of the target film 20. At this time, the ion beam mask 120 partially covers the target film 20 to shield a part of the ion beam. This enables the first and second materials to be implanted selectively into the target film 20 at the central portion Pin of the semiconductor substrate 10 not through the lithography technique. The first and second materials may be implanted using the same ion beam mask 120. By doing so, the first and second materials can be implanted in the same part of the target film 20.

When the ion implantation device 100 emits a ribbon-like ion beam or a spot-like ion beam, it suffices that the ion beam mask 120 and the wafer holder 130 move in a direction perpendicular to the direction of irradiation of the ion beam (either in a vertical direction or a horizontal direction) synchronously with each other. Accordingly, even when the ribbon-like ion beam or the spot-like ion beam is used, the ion implantation device 100 can ion-implants the dopant of the first and second materials into the target film 20 at the central portion Pin substantially uniformly.

Alternatively, ions of the dopant can be implanted selectively into the central portion Pin of the target film 20 using a scan technique of an ion beam. In this case, an ion implantation device 100 causes an ion beam to scan the semiconductor substrate 10 while changing the concentration of the ion beam of the first material. Further, the ion implantation device causes an ion beam to scan the semiconductor substrate 10 while changing the concentration of the ion beam of the second material. The ion implantation device 100 then turns the semiconductor substrate 10 and causes the ion beam to scan the semiconductor substrate 10 again while changing the concentration of the ion beam. In this way, the ion implantation device 100 can selectively implant the first and second materials into a part of the target film 20 without using the ion beam mask 120.

In the second embodiment, a certain amount of the dopant can be implanted into the outer peripheral portion Pex covered by the ion beam mask 120. In this case, it suffices that more ions of the dopant are implanted into the central portion Pin and that the concentration of the dopant in the central portion Pin is sufficiently higher than that of the outer peripheral portion Pex. This is because the polishing rate of the target film 20 at the central portion Pin thus can be higher (faster) than the polishing rate of the target film 20 at the outer peripheral portion Pex.

(Third Embodiment)

Figure 7:
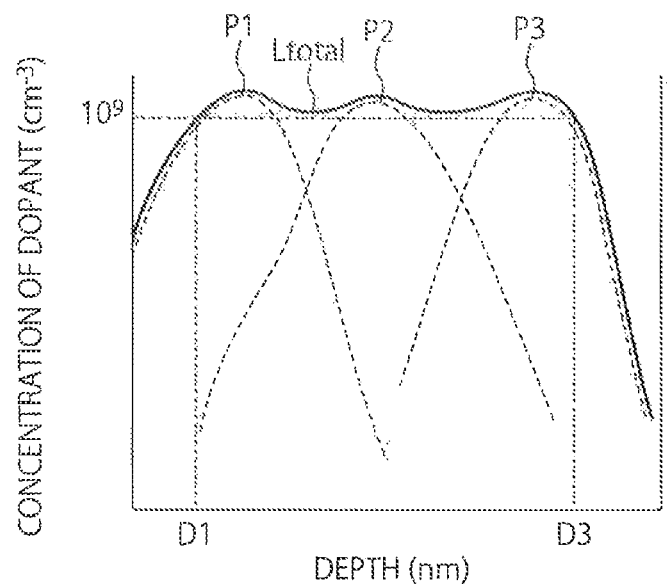
FIG. 7 is a graph showing the concentration of a dopant contained in the target film 20 formed by a manufacturing method of a semiconductor device according to a third embodiment.

FIG. 7 is a graph showing the concentration of a dopant contained in the target film 20 formed by a manufacturing method of a semiconductor device according to a third embodiment. The vertical axis represents the concentration of the dopant and the horizontal axis represents the depth from the surface of the target film 20.

In the third embodiment, to improve the increasing effect on the polishing rate, the ion implantation device 100 implants ions of a dopant into the target film 20 a plurality of times at a plurality of acceleration energies different from each other (multistage ion implantation). The dopant subjected to ion implantation in the third embodiment is the first material and/or the second material. The third embodiment can be applied to any of the first and second embodiments described above.

For example, the ion implantation device 100 implants the ions of the first material at acceleration energies of 10 keV, 30 keV, and 50 keV. The concentration of the dopant of the first material thus has three peaks P1 to P3 in the depth direction of the target film 20 as shown in FIG. 7. P1 indicates a concentration peak of the dopant in a case where the acceleration energy is 10 keV, P2 indicates a concentration peak of the dopant in a case where the acceleration energy is 30 keV. P3 indicates a concentration peak of the dopant in a case where the acceleration energy is 50 keV. Between P1 and P2 in the graph, the dopant in the case where the acceleration energy is 10 keV and the dopant in the case where the acceleration energy is 30 keV overlap. Between P2 and P3 of the graph, the dopant in the case where the acceleration energy is 30 keV and the dopant in the case where the acceleration energy is 50 keV overlap. Therefore, by implanting ions of the dopant at the acceleration energies of 10 keV, 30 keV, and 50 keV, the dopant concentration of the first or second material becomes high ($10^{19} cm^{-3}$ or higher, for example) entirely in the depths from D1 to D3 as shown by a solid line Ltotal in FIG. 7. That is, the dopant concentration profile of the first material (or the second material) has a so-called box-type flat profile in a range of the depths from D1 to D3 from the surface of the target film 20. Accordingly, the polishing rate can be increased in the range of the depths from D1 to D3 of the target film 20. That is, according to the third embodiment, because the polishing rate is increased in a wide range (D1 to D3) in the depth direction of the target film 20, the polishing time of the catalyst-referred etching method can be shortened. Furthermore, when dopant ions of the first material (or the second material) are implanted, the third embodiment can also achieve the effects of the first or second embodiment mentioned above. To increase the polishing rate from the surface of the target film 20, the acceleration energies of the ion implantation device 100 may be adjusted to meet D1=0.

Similarly, when dopant ions of the second material are implanted into the target film 20 a plurality of times at a plurality of acceleration energies different from each other, the dopant concentration profile of the second material has a so-called box-type flat profile in a range of the depths from D1 to D3 of the target film 20. Then, by annealing the target film 20, the polishing rate of the target film 20 can be increased more effectively.

It is also possible that the dopant concentration profiles of both the first and second materials have box-type flat profiles. Accordingly, the effects of the first or second embodiment can be further improved.

The acceleration energies in the multistage ion implantation are not limited to three stages, but can be also two stages or four or more stages. The acceleration energy can be continuously changed, for example, in a range from 1 keV to 200 keV. Furthermore, the dose amount can be adjusted in a range from $1.00 \times 10^{14}/cm^2$ to $1.00 \times 10^{18}/cm^2$ to cause the dopant concentration to have a box-type flat profile in the depth direction of the target film 20.

(Fourth Embodiment)

Figure 8:
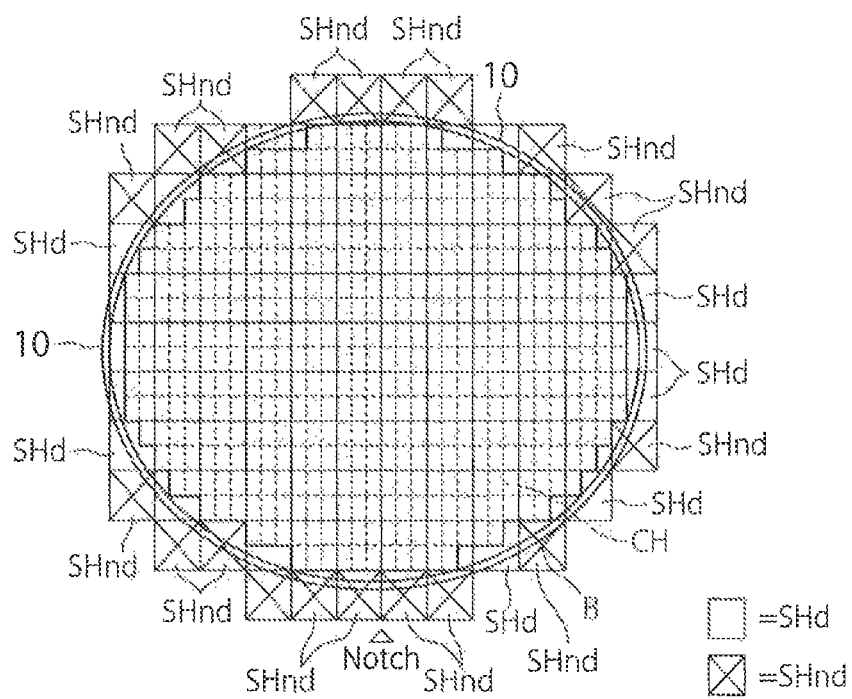
FIG. 8 is a plan view showing a manufacturing method of a semiconductor device according to a fourth embodiment.

FIG. 8 is a plan view showing a manufacturing method of a semiconductor device according to a fourth embodiment. Shots at a lithography step are denoted by solid line frames SHd or SHnd in a plane of the semiconductor substrate 10 shown in FIG. 8. The shot areas SHnd denoted by the frames in which x is shown are areas having patterns (or dummy patterns) not formed. The shot areas SHd denoted by the frames in which x is not shown are areas having patterns (or dummy patterns) formed.

Production chips CH are formed in a thick line frame B of the semiconductor substrate 10. The production chips CH are shown by broken line frames. No production chips CH are formed on the semiconductor substrate 10 outside the thick line frame B. Therefore, dummy patterns are formed in parts of the shot areas SHd outside the thick line frame B. Patterns (or dummy patterns) are not formed in an area outside the thick line frame B corresponding to the shot areas SHnd.

Generally, the semiconductor substrate 10 has an outer peripheral portion in which patterns of production chips are not formed as shown in FIG. 8. To improve throughput at the lithography step, photolithography shots are in some cases not performed on the outer peripheral portion in which no production chips are formed. In these cases, the areas SHd to which shots are performed and in which patterns (or dummy patterns) are formed and the areas SHnd to which no shots are performed and in which patterns (or dummy patterns) are not formed are mixed in the outer peripheral portion of the semiconductor substrate 10. If the semiconductor substrate 10 is etched in such a state, the polishing rates differ between the areas SHd and the areas SHnd. Because patterns (or dummy patterns) are not formed in the shot areas SHnd, a material layer remains as it is. Therefore, in the shot areas SHnd, it is preferable to increase the polishing rate to suppress occurrence of layer remaining. On the other hand, because patterns (or dummy patterns) are formed in the areas SHd, the areas SHd are polished more easily than the areas SHnd. Therefore, if the polishing rate is increased, excessive polishing may occur in the areas SHd.

In the fourth embodiment, the first and second materials are implanted selectively into the shot areas SHnd of the surface area of the target film 20 on the semiconductor substrate 10. The first and second materials are not implanted to the shot areas SHd. Accordingly, the etching rate of the shot areas SHnd is increased to set the polishing rate of the shot areas SHnd closer to the polishing rate of the shot areas SHd.

Figure 9:
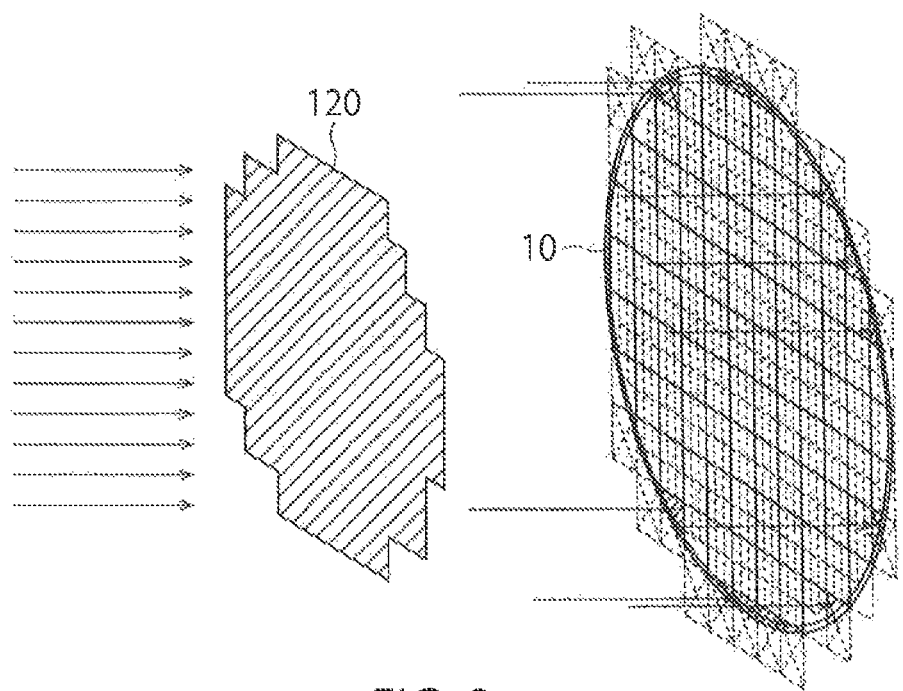
FIG. 9 is a schematic configuration diagram showing the ion implantation device 100 including the ion beam mask 120 according to the fourth embodiment.

FIG. 9 is a schematic configuration diagram showing the ion implantation device 100 including the ion beam mask 120 according to the fourth embodiment. The ion implantation device 100 is basically the same as that of the second embodiment except the shape of the ion beam mask 120. Therefore, the ion source 110, the extraction electrode 111, the accelerator 115, the mass separator 116, the scanner 117, and the like are omitted in FIG. 9.

The ion beam mask 120 is formed to block an ion beam irradiated to the chips CH and the shot areas SHd of the semiconductor substrate 10 and to allow an ion beam irradiated to the shot areas SHnd to pass. Accordingly, ions of the dopant are implanted into the shot areas SHnd not having patterns (or dummy patterns). In FIG. 9, the ions of the dopant are implanted into a hatched portion of the target film 20. The material of the ion beam mask 120 can be identical to that of the second embodiment.

In this way, the polishing rate in the shot areas SHnd can be increased to be closer or equal to the polishing rate in the shot areas SHd. This prevents excessive polishing of the target film 20 in the shot areas SHd among edge portions of the target film 20 and achieves sufficient removal of the target film 20 in the shot areas SHnd. Accordingly, variations in the film thickness (film reduction) at the edge portions of the target film 20 can be suppressed.

Furthermore, the type of dopant to be implanted into the shot areas SHnd and the dose amount thereof can be changed according to an occupancy rate of the production chips CH in the plane of the semiconductor substrate 10. The type of dopant to be implanted into the shot areas SHnd or the dose amount thereof can be changed according to an occupancy rate of convex portions (or concave portions) in the production chips CH. In this way, the etching rate of the shot areas SHnd can be controlled similarly to the etching rate of the shot areas SHd in various semiconductor products.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate processing method comprising:
   implanting a first material into a surface of a target film to be processed in order to modify the surface of the target film;
   implanting a second material into the surface of the target film;
   thermal treating the target film; and
   dissolving the surface of the target film to remove the surface of the target film by bringing a catalytic material close to the surface of the target film or by contacting the catalytic material to the surface of the target film while supplying a process solution on the surface of the target film which has been modified.

2. The method according to claim 1, wherein
   the first material breaks or weakens bindings of the target film,
   the second material binds to material of the target film, and
   in the dissolution of the target film, the target film is removed in conjunction with the second material.

3. The method according to claim 1, wherein
   the thermal treating is executed at the same time as the implantation of the second material.

4. The method according to claim 2, wherein
   the thermal treating is executed at the same time as the implantation of the second material.

5. The method according to claim 1, wherein
   the surface of the target film includes at least one of silicon carbide (SiC), gallium nitride (GaN), and aluminum oxide ($Al_2O_3$).

6. The method according to claim 2, wherein
   the surface of the target film includes at least one of silicon carbide (SiC), gallium nitride (GaN), and aluminum oxide ($Al_2O_3$).

7. The method according to claim 3, wherein
   the surface of the target film includes at least one of silicon carbide (SiC), gallium nitride (GaN), and aluminum oxide ($Al_2O_3$).

8. The method according to claim 1, wherein
   the first material includes at least one of fluorine (F), boron (B), phosphorus (P), nitrogen (N), arsenic (As) and gallium (Ga), and
   the second material includes at least one of silicon (Si), carbon (C), germanium (Ge) and gallium (Ga).

9. The method according to claim 2, wherein
   the first material includes at least one of fluorine (F), boron (B), phosphorus (P), nitrogen (N), arsenic (As) and gallium (Ga), and
   the second material includes at least one of silicon (Si), carbon (C), germanium (Ge) and gallium (Ga).

10. The method according to claim 3, wherein
    the first material includes at least one of fluorine (F), boron (B), phosphorus (P), nitrogen (N), arsenic (As) and gallium (Ga), and
    the second material includes at least one of silicon (Si), carbon (C), germanium (Ge) and gallium (Ga).

11. The method according to claim 1, wherein
    the thermal treating is executed at a temperature equal to or higher than 400° C.

12. The method according to claim 3, wherein
    the thermal treating is executed at a temperature equal to or higher than 400° C.

13. The method according to claim 1, wherein
    the first material is partially implanted into a part of the surface of the target film.

14. The method according to claim 1, wherein
    the first and second materials are partially implanted into a part of the surface of the target film.

15. The method according to claim 2, wherein
    the first and second materials are partially implanted into a part of the surface of the target film.

16. The method according to claim 1, wherein
    the first or the second material is implanted into the target film a plurality of times at a plurality of acceleration energies different from each other.

17. The method according to claim 2, wherein
    the first or the second material is implanted into the target film a plurality of times at a plurality of acceleration energies different from each other.

* * * * *